(12) United States Patent
Leiphart

(10) Patent No.: US 6,833,623 B2
(45) Date of Patent: Dec. 21, 2004

(54) ENHANCED BARRIER LINER FORMATION FOR VIA

(75) Inventor: Shane P. Leiphart, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/371,955

(22) Filed: Aug. 11, 1999

(65) Prior Publication Data

US 2002/0008322 A1 Jan. 24, 2002

(51) Int. Cl.[7] .................. H01L 23/48; H01L 23/52; H01L 21/4763
(52) U.S. Cl. .................. 257/758; 257/765; 257/771; 257/774; 257/777; 438/622; 438/629; 438/640; 438/700
(58) Field of Search .................. 257/437, 758, 257/771, 774, 763–767, 777; 438/629, 640, 653–656, 700

(56) References Cited

U.S. PATENT DOCUMENTS

| 4,656,605 | A | * | 4/1987 | Clayton ............... 365/52 |
| 5,281,850 | A | * | 1/1994 | Kanamori ............... 257/758 |
| 5,312,775 | A | * | 5/1994 | Fujii et al. ............... 438/625 |
| 5,313,101 | A | * | 5/1994 | Harada et al. ............... 257/758 |
| 5,341,026 | A | | 8/1994 | Harada et al. |
| 5,358,901 | A | * | 10/1994 | Fiordalice et al. ............... 437/192 |
| 5,480,836 | A | | 1/1996 | Harada et al. |
| 5,670,421 | A | | 9/1997 | Nishitani et al. |
| 5,869,901 | A | | 2/1999 | Kusuyama |
| 6,268,284 | B1 | * | 7/2001 | Cerio, Jr. ............... 438/643 |

* cited by examiner

Primary Examiner—Donghee Kang
(74) Attorney, Agent, or Firm—Dickstein Shapiro Morin & Oshinsky LLP

(57) ABSTRACT

A high integrity, reliable liner is disclosed for a via in which a titanium aluminide layer is preformed as a lining within a via hole prior to deposition of other conductive materials within the via hole. The conductive materials deposited on the preformed titanium aluminide can be either a secondary barrier layer portion of the liner, such as a titanium compound layer, which in turn has a metal plug deposited thereon, or, alternatively, a metal plug directly deposited on the titanium aluminide layer. An important advantage achieved by the present invention is that a via is formed with a substantial elimination of void formation. The enhanced vias are useful in a wide variety of semiconductor devices, including SRAMS and DRAMs.

14 Claims, 5 Drawing Sheets

ENHANCED BARRIER LINER FORMATION FOR VIA

BACKGROUND OF THE INVENTION

1. The Field of the Invention

The present invention generally relates to formation of vias. More particularly, the present invention relates to the formation of semiconductor devices having vias that are more reliable and free of defects.

2. The Relevant Technology

Integrated circuits are manufactured by an elaborate process in which a variety of different microelectronic devices are integrally formed on a semiconductor substrate such as a silicon wafer or a silicon-on-insulator (SOI) structure. In advanced manufacturing of integrated circuits, hundreds of thousands of electronic devices can be formed on a single substrate.

One of the steps in the fabrication of integrated circuits is to form generally horizontal metallic interconnection or wire lines between the discrete microelectronic devices on the integrated circuit and to external circuitry. The horizontal metallic interconnections are conducting layers that permit an electrical current to be delivered to and from the various microlectronic devices so that the integrated circuit can perform its intended function. Since the integrated circuitry needed for a semiconductor is usually build-up three-dimensionally on the substrate in order to increase the packing density and so forth, multi-level metallizations are generally necessary and employed in which inter-level dielectric layers are interposed between different metallization levels formed on the device substrate.

Vias, also referred to as "vertical interconnects," are used to electrically connect different horizontal levels of metallization. The via is a via hole or through hole filled with a conductor material that extends through a dielectric interposed between surfaces of two separate horizontal metallization levels. The metallization process is repeated as needed to form additional levels and to form a plurality of similar horizontal and vertical conductive interconnections. Among other things, the yield, performance and reliability of the semiconductor device critically depend on the stability and integrity of the vias.

Referring to FIG. 5, a conventional via structure is shown in which a first horizontal metallic interconnection layer 51 is formed on a first dielectric layer 50 that has previously been formed on a substrate or an inter-level dielectric, depending on which two metallization levels are being interconnected. The first interconnection layer 51 commonly is aluminum or an aluminum alloy layer material, such as Al, Al—Cu or Al—Cu—Si. An anti-reflective coating (ARC) layer 52 is formed on the surface of the first interconnection layer 51. A second dielectric layer 53 is formed on the first interconnection layer 51 (and the ARC layer 52). A via-hole 500 is formed through dielectric layer 53 and the ARC layer 52 to expose a discrete surface region of the first interconnection layer 51 at the bottom of the via hole 500. The via hole 500 is lined with a titanium layer 54 and titanium nitride layer 55 (i.e., Ti/TiN) provided on the sidewalls and bottom of the via hole 500. Then, a refractory metal is deposited in the via hole 500 hole to form a conductive via plug 56. A conventional way to form the refractory metal plug 56 is by forming tungsten on the lined via hole 500 by hydrogen or silane reduction of tungsten hexafluoride ($WF_6$) in a CVD process. Tungsten formed by chemical vapor deposition (CVD) has poor adhesion to commonly used inter-level dielectrics such as silicon oxides. The Ti layer 54 is a good dielectric-to-metal adhesion layer, forms a good ohmic contact, and reduces surface oxides on the aluminum. However, the Ti layer 54 tends to adversely react with refractory halide precursors commonly used in depositing the refractory metal plug 56, such as tungsten hexafluoride. TiN provides a protective barrier for the Ti to suppress such undesired reactions. Hence, the TiN overlayer 55 is used as an additional component of the conventional dual-layer via lining under discussion. After deposition of the refractory metal plug 56, the workpiece surface is planarized so that the surface of the plug 56 is made co-planar with the second dielectric layer 53. A second metallic interconnection layer, not shown, then would be formed on the planarized plug 56 and second dielectric layer 53.

However, when titanium is put in contact with aluminum, such as occurs at the interface between the Ti layer 54 and a surface portion of a first aluminum interconnection layer 51 exposed at the bottom of via hole 500, the titanium and aluminum tend to react during high temperature processing. This results in the formation of a titanium aluminide region at or near their interface. For instance, as indicated in FIG. 5, a titanium aluminide region 57 has formed in this manner at the bottom region of the via, such as during the deposition of tungsten by CVD as the refractory plug 56 or a subsequent post metal deposition anneal procedure. It is known that titanium aluminide, viz., $TiAl_3$, occupies less volume than the elemental titanium and aluminum consumed to produce it. This tends to create voids within a plug.

For instance, a voiding problem has been identified, which is illustrated in FIG. 5 as a void defect 58, as occurring in conventionally fabricated vias having titanium liners. Namely, a breakdown in the dual-layer via lining (54, 55) occurs as shown as a crack through the via lining leading to a cavity or void 58 in the first aluminum interconnection layer 51. The cracked TiN permits free fluorine to attack the exposed aluminum and Ti—Al which can create large voids. The presence of such a void space can undermine the performance and reliability of the entire hole connection. For instance, the mechanical strength of the via is reduced due to the presence of the voids. Additionally, if the first aluminum interconnection layer 51 becomes too narrow due to the voiding phenomenon occurring beneath the via, the underlying conducting layer can void out so as to cause a gap in the line resulting in an open circuit condition.

Aluminum plugs also tend to have poor adhesion to a silicon dioxide dielectric layer such that the aluminum plugs can separate or "de-wet" from the sidewall of the via hole. This problem can be aggravated by a high aspect ratio (height/width ratio) requirement for the via hole, which makes the hole even harder to fill. A conventional solution to this problem with aluminum plugs has involved depositing a wetting layer of titanium on the walls of the hole before filling the hole with aluminum. However, in conventional aluminum plug processing, titanium aluminide was formed in situ during and concurrent with deposition of the aluminum plug material on the titanium. This also has lead to void problems making it more difficult to achieve a tight via.

Consequently, a need exists in the art for a via having reduced voiding problems and methodology for imparting such increased resistance to void formation and damage.

SUMMARY OF THE INVENTION

The present invention resolves the above and other problems that have been experienced in the art. More particularly, the present invention constitutes an advancement in the art by providing a high integrity liner for a via in which a titanium aluminide layer is preformed as a lining within at least part of a via hole prior to deposition of other conductive materials within the via hole. The conductive materials deposited on the preformed titanium aluminide can be either a secondary barrier layer portion of the liner, such as a titanium compound layer, which in turn has a metal plug deposited thereon, or, alternatively, a metal plug directly deposited on the titanium aluminide layer. An important advantage achieved by the present invention is that a via is formed with a substantial elimination of void formation.

A general method of the present invention for forming such an improved via of a semiconductor device includes forming a dielectric layer over a metallic layer (such as a metal interconnection layer formed over a substrate). A via hole is formed through the dielectric layer to expose a surface portion of the metallic layer at a bottom of the via hole. A preforming of a titanium aluminide layer on the exposed surface portion of the metallic layer is conducted. The titanium aluminide layer can be formed on the bottom only of the via hole or the bottom and sidewalls of the via hole, depending on the embodiment of this invention. Thereafter, a conductive material is deposited in the via hole on the preformed titanium aluminide layer. The semiconductor devices fabricated according to this invention have superior quality and reliability due to the enhanced via formations.

In one particular embodiment, a titanium aluminide layer is preformed at least at the bottom side of a via hole on an exposed surface portion of an underlying aluminum interconnection line before an overlying TiN barrier layer is deposited in the via hole. This procedure significantly prevents cracking of the relatively brittle TiN barrier layer which otherwise would occur during deposition of the refractory metal plug. That is, if the titanium aluminide layer is not preformed according to the present invention in fabrications where a tungsten plug is formed on a TiN layer by reduction of tungsten hexafluoride, then a volume reduction and a shrinkage or contraction of the Ti—Al interface will occur during a deposition of the metal plug which will put tension on an overlying TiN layer due to the stress within the layers. Such stress in the layers, which is avoided by the present invention, causes cracks through which fluorine can infiltrate the liner and form voids in the aluminum layer. The present invention prevents such fluorine attack on the underlying aluminum line due to the intervening high integrity (minimally cracked) titanium nitride layer and preformed titanium aluminum layer.

Also, if a TiN barrier liner layer coverage is incomplete or extremely thin in spots, the present invention will prevent fluorine attack on the aluminum lines through those otherwise vulnerable areas on account of the presence of the preformed fluorine-resistant titanium aluminide liner layer. Experiments, described herein, have been conducted which confirm this fluorine barrier capability of titanium aluminide via liners.

The present invention embodies several useful techniques for preforming the titanium aluminide via liners. In one technique, titanium aluminide can be deposited as a discrete layer in place of the conventional titanium layer used in a via hole such that no volume reduction will occur since a titanium aluminide material will already have been formed and line the via hole before TiN deposition and plug metal deposition. A discrete titanium aluminide liner film can be deposited, for example, by sputtering. Another technique for preforming the titanium aluminide liner involves an pre-emptive anneal approach in which a titanium liner film is formed in a via hole and on the exposed surface portion of the underlying aluminum conductor line, and then the deposited titanium film is immediately subjected to heat after its deposition, and prior to TiN deposition, sufficient to form titanium aluminide at the Ti—Al interface. As a consequence, the volume reduction associated with titanium aluminide formation occurs in the absence of and without adverse affect upon the TiN layer.

The usefulness of the improved vias of the present invention is not limited to refractory metal plug applications, but also extends to other via plug environments such as aluminum plugs. Additionally, the semiconductor devices made according to this invention are endowed with tight, high-reliability vertical interconnect structures applicable to SRAMs, DRAMs, and many other integrated circuit devices.

BRIEF DESCRIPTION OF THE DRAWINGS

The foregoing and other features, aspects and advantages of the present invention will become more apparent from the following detailed description of the present invention when considered in conjunction with the accompany drawings, in which.

It will be understood that the drawings are provided for illustrative purposes and that the depicted features are not necessarily drawn to scale.

DETAILED DESCRIPTION OF THE PREFERRED EMBODIMENTS

Figure 1:
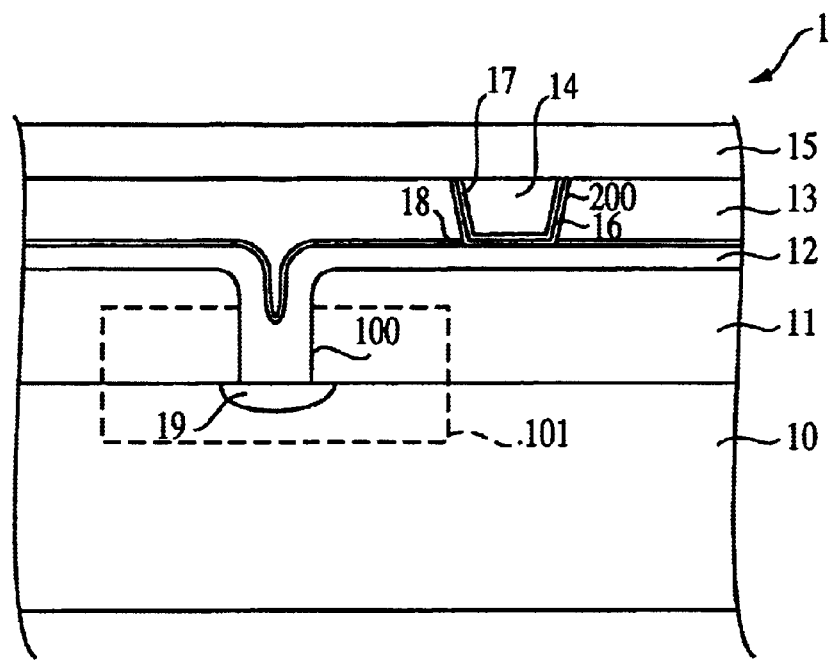
FIG. 1 is a partial sectional view showing a semiconductor memory device including a via structure fabricated according to an embodiment of the present invention.

Referring now to the FIG. 1, a schematic cross-sectional view of a semiconductor integrated circuit device 1 is shown as made according to the present invention. In one preferred embodiment, the semiconductor device 1 is an in-process integrated circuit memory cell, such as an SRAM cell or a DRAM cell, on a chip. A semiconductor substrate 10 has a first dielectric layer 11 formed upon it as a passivation layer. In particular, the substrate 10 is a p-type silicon substrate and the dielectric (passivation) layer 11 preferably is silicon dioxide ($SiO_2$). The term "substrate", as used herein, generally refers to the one or more semiconductor layers or structures which includes active or operable portions of semiconductor devices. For instance, the substrate 10 could be a silicon wafer, a silicon-on-insulator (SOI) structure, a substrate assembly, and so forth, within the contemplated practice of this invention.

A first horizontal metallic interconnection layer 12 is formed on the first dielectric layer 11. Standard deposition and photolithographic patterning techniques employed for thin metallic films can be used to deposit and pattern the horizontal metallic interconnection layers described herein. The horizontal metallic interconnection layers used in this invention generally are conductors made of thin films of aluminum or its alloys, such as Al—Cu or Al—Cu—Si. The aluminum films can be sputter deposited to a given thickness, although other known thin metal film deposition techniques also could be used. The first metallic interconnection layer 12 contacts an impurity diffusion region 19 in the surface of substrate 10 through a contact hole 100. The region 101 indicates a part of an active device region formed at the surface of the substrate 10. The active device region 101 is not particularly limited for purposes of this invention, as the enhanced via structures derived by the present invention should be generally applicable and implementable in metallization schemes for a wide variety of semiconductor device fabrications. Therefore, the active device region 101 can represent structures associated with memory devices including a SRAM cell, a DRAM cell, EPROM cells, EEPROM cells, and so forth, of conventionally known designs therefor or otherwise. However, the invention also is generally applicable to microcomputer circuit components, CMOS logic circuit components, bipolar transistor components, and so forth. These active device regions can have conventional structures and architecture within the knowledge and capabilities of a person of skill in this field of endeavor, but are not limited thereto.

Referring still to FIG. 1, an anti-reflective coating (ARC) layer 18 is deposited on the surface of the first metallic interconnection layer 12. The ARC layer can be a sputtered TiN film. A second dielectric layer 13 is formed on the first metallic interconnection layer 12 (and the ARC layer 18). The dielectric layers described herein are non-conducting layers having a thickness sufficient for that purpose that can be formed by depositing a silicon oxide, such as tetraethylorthosilicate (TEOS)-based silicon oxide.

A via hole 200 is formed through diectric layer 13 and the ARC layer 18 such that a surface portion 12' of the first metallic interconnection layer 12 is exposed. The dielectric layers can be anisotropically etched to form the connection holes using an appropriately patterned photoresist with a fluorine-based plasma which removes exposed dielectric at the desired location of the connection hole. A variety of etch processes known to those of skilled in the art can be used for etching the dielectric and TiN ARC layer. The cross-sectional geometry of the via hole 200 is not particularly limited and can be cylindrical, rectangular, square, oval, and so forth.

In this embodiment, a dual-layer lining comprised of a titanium aluminide layer 16 and a titanium nitride layer 17, in that sequence, is formed on the sidewalls and bottom of the via hole 200. The titanium aluminide layer 16 is preformed before the titanium nitride layer is deposited thereon. Exemplary techniques of this invention for preforming a titanium aluminide are described in greater detail in discussions set out below referencing FIGS. 2–4. To form the titanium nitride (TiN) layer 17, a reactive sputtering method can be used, in which the sputtering is effected in an ambient gas of $N_2$+argon using a titanium target. The titanium nitride is deposited in a manner that provides complete coverage of the via hole sidewalls and the bottom of the via hole prelined with the titanium aluminide layer 16. A titanium nitride layer having a thickness of approximately 500–1000 Å generally is formed. The TiN layer 17 also could be deposited by other known techniques such as CVD. Also, the titanium nitride layer 17 could be replaced by a different type of titanium compound or other sufficiently conductive material that can be deposited as a thin film which provides comparable barrier functionality, such as a Ti—W thin film.

A preforming of the titanium aluminide layer 16 before the titanium nitride layer 17 is deposited avoids stress-fracturing in the titanium nitride layer 17, which, in turn, prevents fluorine attack on the underlying aluminum line 12 during fabrication by the fluorine content of the reactant gas used to deposit the plug 14 in a subsequent processing step. Additionally, it has been observed and determined that the titanium aluminide layer 16 itself offers good resistance to fluorine attack. This attribute of a preformed titanium aluminide layer is important because it will protect the aluminum line from fluorine attack where an inadvertent discontinuity or opening occurs in the titanium nitride layer. In any event, the titanium nitride layer 17 well retains its film integrity through the rest of fabrication on account of the inventive protocols described herein for forming the underlying titanium aluminide layer prior to depositing the titanium nitride layer 17.

A refractory metal plug 14 is then deposited in the titanium aluminide/TiN-lined via hole 200. The refractory metal plug layer, such as tungsten, molybdenum, titanium, tantalum, or the like, can be deposited by CVD to conformally blanket coat the lined via hole and adjoining dielectric flats of the intermediate device structure. For instance, tungsten (W) can be deposited in the lined via hole 200 by conventional CVD methods using a hydrogen and/or silane hydrogen reduction of tungsten hexafluoride ($WF_6$) in which the premixed reactant gases are directed onto the surface of the intermediate semiconductor structure having the lined via holes to be coated, which is maintained at an elevated temperature of approximately 440–450° C. for a process time that is sufficient to fill the lined via hole. When the mixed gases contact the substrate surface at the elevated temperature, the tungsten hexafluoride and the hydrogen (and/or silane) react to produce elemental tungsten (W), which is deposited upon onto the substrate as a film. A via or vertical interconnect structure has been formed at this juncture of the processing. The refractory metals can be used individually, as combinations thereof, or in combination with other low resistance materials to form the plug.

As indicated by FIG. 1, the deposited via plug 14 is planarized until made generally coplanar with the surface of the second dielectric layer 13. The refractory metal deposited upon the plug-filled intermediate structure can be planarized using chemical-mechanical planarization (CMP), mechanical abrasive pad polishing, RIE (e.g., $Cl_2$), or other suitable planarizing techniques used for this purpose. This planarization step may not be necessary for all implementations depending on design criteria and so forth.

A second horizontal metallic interconnection layer 15 is formed on the second dielectric layer 13 in contact with plug 14 to provide the second metallization level. The via 201 is a vertical interconnect structure between the metallic interconnection layers 12 and 15. The horizontal metallic interconnection layers are electrical conductor layers that can electrically communicate with each other through the vias. Additionally, if the via 201 is not planarized it is possible to change the sequence of processing steps such that the second horizontal metallic interconnection layer 15 is formed before formation of the via 201 because portions of the as deposited tungsten step profile will rest over the second dielectric around the perimeter of the upper entrance of the via hole where the tungsten can contact a previously formed horizontal metallic layer.

The above general processing scheme permits formation of one or more high-integrity, reliable vias between two horizontally-extending conductor layers that are vertically spaced apart from each another over the substrate. This general processing scheme can be repeated one or more times to form additional metallization levels if necessary or desired for the semiconductor integrated circuit device.

Figure 2:
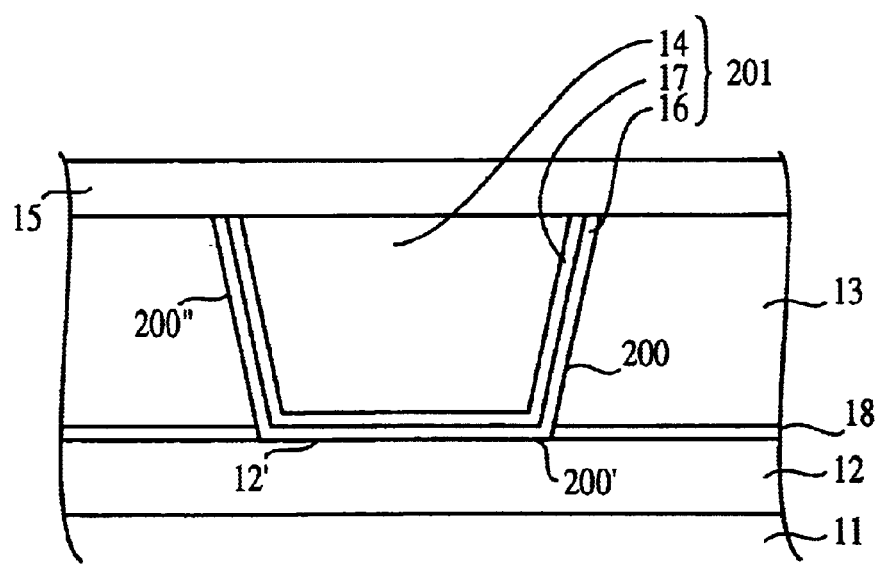
FIG. 2 is a partial sectional view showing an enlarged view of the via structure in FIG. 1 as made according to one embodiment of the present invention.

FIG. 2 shows an enlarged view of the via of FIG. 1 as fabricated according to a first embodiment of this invention. The via hole 200 is defined by a bottom 200' and sidewalls 200". The bottom 200' of the via hole 200 is the exposed surface of the underlying interconnection layer 12 until the via hole 200 is lined. The dielectric layers 11 and 13 and the ARC layer 18 are the same as described in connection with FIG. 1. Titanium aluminide 16 is directly sputter deposited on the via hole 200. To accomplish this, a titanium aluminide target is used in a sputtering chamber at approximately 2 kW dc target power at 1.5 mtorr pressure. When depositing titanium aluminide directly by sputtering, the titanium aluminide layer is formed at a thickness of approximately 100 to 700 Å, preferably about 400 Å, to provide the barrier properties desired of it.

The titanium aluminide is an intermetallic broadly represented by the formula $Ti_x$. Preferably, for purposes of the present invention, the titanium aluminide is $TiAl_3$, although $TiAl_2$, and combinations of $TiAl_3$ and $TiAl_2$ in all mixing ratios are also contemplated for use as the target material used in this embodiment.

The titanium aluminide via lining 16, once formed, makes interfacial physical contact with the top surface 12' of the conductor line 12 at the bottom 200' of the via hole 200. The TiN layer 17 and the plug 14 are then deposited over the preformed titanium aluminide as described above to form a via 201, which is a vertical interconnect between the aluminum conductor lines 12 and 15.

Figure 3:
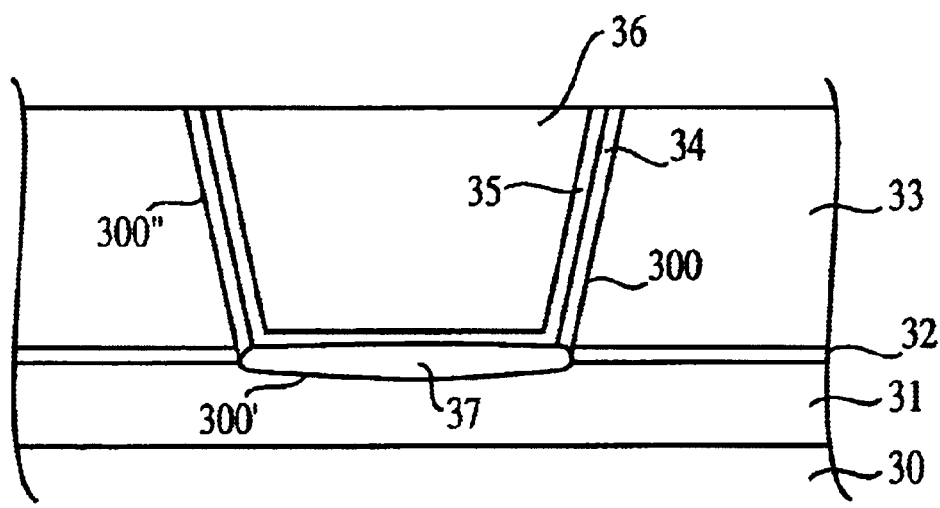
FIG. 3 is a partial sectional view showing a via structure made according to another embodiment of the present invention.

FIG. 3 shows an enlarged view of a via fabricated according to a second embodiment of this invention. In this embodiment, the titanium aluminide 37 is formed in situ by heating a deposited titanium film 34 as a source material before further materials are deposited in the via hole 300. A titanium film 34 can be deposited by methods described earlier. After deposition of the titanium, the heating of the wafer can be conducted by transferring it in a vacuum to a heated pedestal where the titanium aluminide is formed, such as by using a CVD reactor-equipped cluster tool. Alternatively, the titanium film can be deposited in a single chamber using a heated pedestal to support the intermediate semiconductor workpiece such that titanium aluminide is formed rapidly as the elemental titanium is deposited on the exposed aluminum surface of aluminum conductor line 31. The dielectric layers 30 and 33 and the ARC layer 32 are of the same types as described in connection with FIG. 1.

In one preferred implementation, the titanium aluminide layer 37 is formed by annealing at approximately 140 seconds at a 465° C. chuck temperature in a chamber. An approximately 50 to 300 Å titanium layer can deposited and the annealing is performed for a time sufficient such that the titanium at the bottom of the via hole 300 is substantially if not completely reacted with surface portions of the underlying aluminum conductor line 31 to form the titanium aluminide layer portion 37 at the bottom 300' of the via hole 300. The resulting titanium aluminide layer portion 37 can have a thickness of approximately 100 to 700 Å, preferably about 400 Å, to provide the barrier properties desired of it. The titanium film deposited to line the sidewalls 300" and out of contact with aluminum of via hole 300 remains elemental titanium after the titanium aluminide formation.

The titanium aluminide formed in situ by the annealing operation is predominantly $TiAl_3$, although some minor fraction of $TiAl_2$, and $TiCu_4$ where Al—Cu alloys are involved, can be present but do not effect the result. Then, a TiN layer 35, a plug 36, and an overlying conductor layer (not shown) are successively deposited over the preformed titanium aluminide as described above to form a via.

Experimentation has been performed which demonstrated and confirmed the barrier attributes possessed by the titanium aluminide layers formed according this invention. Specifically, 200 Å of Ti was deposited on top of 3.8 k Å of Al formed on each of two separate Si wafers. A first Ti-coated wafer was heated in an anneal chamber to a temperature and for a time sufficient to form $TiAl_3$ by reaction of substantially all the Ti film with the contacted aluminum surface. The second Ti-coated wafer was not annealed. No TiN barrier layer was deposited over either test wafer. Then both wafers were subjected to fluorine attack in a CVD reactor chamber by exposure to $WF_6$ and heat of approximately 440° C. This comparative test represented a worst case scenario by creating an environment comparable to cracking in a TiN barrier layer of where the TiN layer is discontinuous at the via bottom. As to the results of the experimentation, when viewed under high magnification, the first wafer having the $TiAl_3$ surface layer formed on the Al had no significant indications of fluorine attack. By contrast, the bare Ti-coated wafer suffered extensive fluorine attack seen as a dense cluster of island-like spots all across the surface of the Ti film. These results demonstrated that preformed titanium aluminide layers have high resistance to fluorine attack. Therefore, the preformed titanium aluminide layer formed in this invention provides a back-up measure of protection, in addition to the TiN barrier layer, against fluorine attack during fabrication of the vias.

Figure 4:
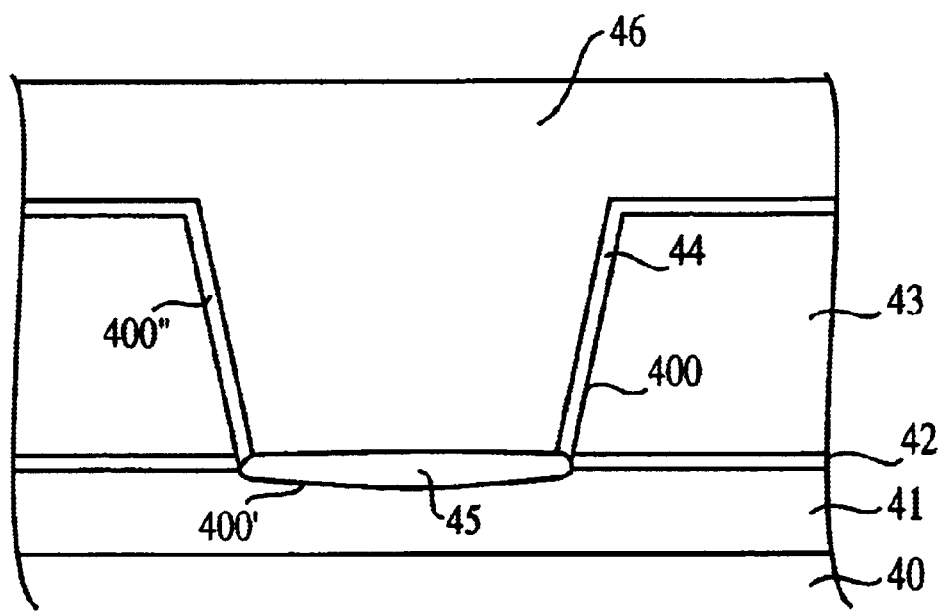
FIG. 4 is a partial sectional view showing a via structure made according to yet another embodiment of the present invention.
Figure 5:
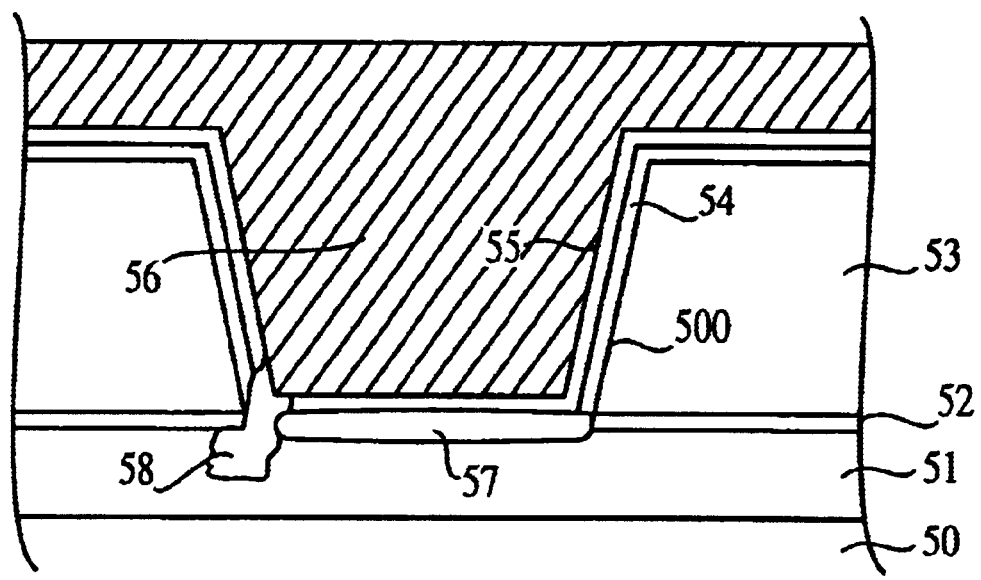
FIG. 5 is a partial sectional view showing a conventional via structure.

FIG. 4 shows an enlarged view of a via fabricated according to a third embodiment of this invention. This embodiment concerns application of the invention to aluminum plugs. The dielectric layers 40 and 43, and the ARC layer 42, are the same as previously discussed. Before filling the via hole 400 with an aluminum plug 46, a titanium aluminide layer 45 is formed. This can be accomplished by either of the aforementioned methods for providing a titanium aluminide liner layer. That is, in one approach, a titanium layer 44 is deposited on the side walls 400" and at the bottom 400' of the via hole 400 where a surface portion of an aluminum conductor line 41 is exposed. The portion of the titanium film 44 deposited on the aluminum film 41 are converted to titanium aluminide in situ by annealing, such as using the annealing procedures described in connection with FIG. 3. Alternatively, a continuous titanium aluminide layer 45 could formed which covers the bottom 400' and sidewalls 400" of the via hole 400 using the titanium aluminide sputtering technique described above in connection with FIG. 2. Then, an aluminum plug 46 is deposited in the lined via hole 400, such as by sputtering or other known deposition methods for this purpose. After depositing the aluminum plug 46, planarization is conducted and the next metallization level is formed. The formation of the titanium aluminide prior to deposition of the aluminum plug 46 makes the via structure more stable for plug formation. That is, the extent of the titanium aluminide formation reactions that might occur during plug formation is significantly reduced by the $TiAl_3$ preforming procedure to help control voiding problems.

After forming the vias need for an entire metallization stack according to any of the above embodiments, a secondary anneal optionally can be conducted to enhance the uniformity of the titanium aluminide layer, cure any defects within the deposited materials, and ensure adhesion between the materials. Since any elemental titanium in contact with aluminum has already been converted to titanium aluminide, the secondary annealing does not raise the risk of any further substantial Ti—Al reactions occurring that would lead to void formation problems.

Figure 6:
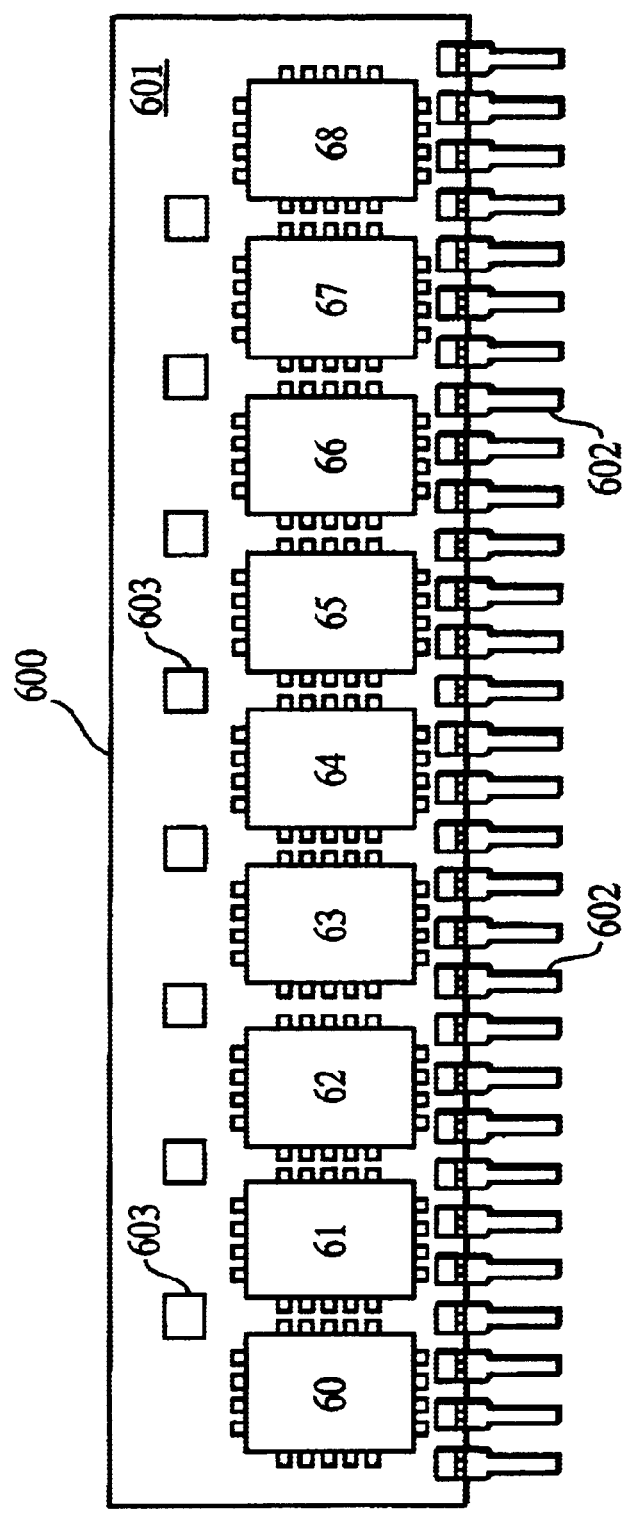
FIG. 6 is a plan view of a memory module having memory chips constructed in accordance with the present invention.

FIG. 6 is plan view of a memory module 600 having memory chips 60–68 including semiconductor memory devices constructed in accordance with the present invention. That is, chips 60–68 have an SRAM or a DRAM cell 1 such as described in connection with FIG. 1. Memory module 600 is a SIMM (single in line memory module) having nine memory chips (IC's) 60–68 aligned on one side of a printed circuit board substrate. The number of such memory chips in the SIMM typically will vary between 3 to 9. The circuit board 601 has an edge connector 602 along one longitudinal edge to permit it to plug into a memory socket on a computer motherboard of conventional design (not shown). A wiring pattern (not shown), which can be a conventionally known design for this purpose, is formed on the board 601 and connects the terminals or leads shown comprising the edge connector 602 to the memory chips 60–68. Small ceramic decoupling capacitors 603 are also mounted on substrate 601 to suppress transient voltage spikes. Other than the inventive memory device structures used in memory chips 60–68, than general layout of the SIMM 600 can be a conventional construction.

Figure 7:
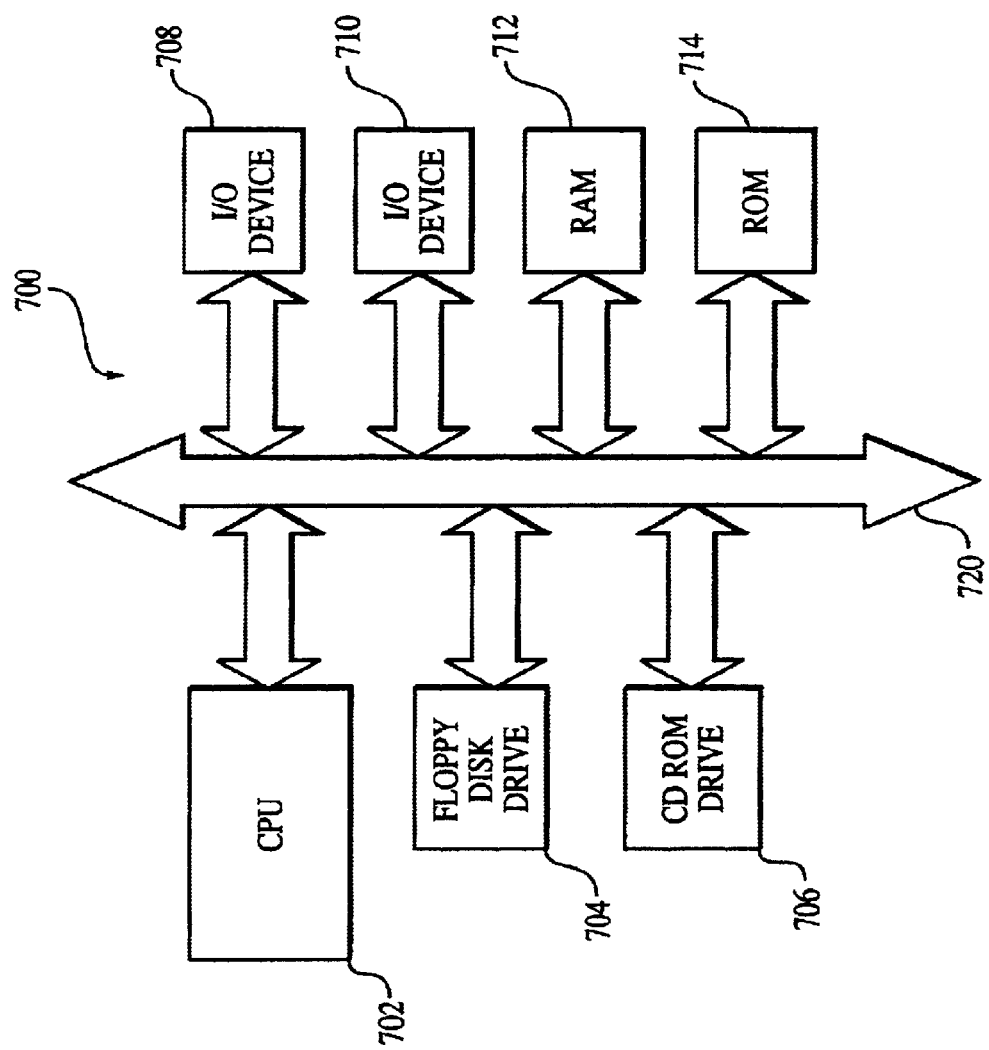
FIG. 7 is a block diagram of a processor-based system using RAM having memory chips constructed in accordance with the present invention.

FIG. 7 is a block diagram of a processor-based system 700 using RAM 712 constructed in accordance with the present invention. That is, RAM 712 uses an SRAM or DRAM cell 1 such as described in connection with FIG. 1. The processor-based system 700 may be a computer system, a process control system or any other system employing a processor and associated memory. The system 700 includes a central processing unit (CPU) 702, e.g., a microprocessor, that communicates with the RAM 712 and an I/O device 708 over a bus 720. It must be noted that the bus 720 may be a series of buses and bridges commonly used in a processor-base system, but for convenience purposes only, the bus 720 has been illustrated as a single bus. A second I/O device 710 is illustrated, but is not necessary to practice the invention. The processor-based system 700 also includes read-only memory (ROM) 714 and may include peripheral devices such as a floppy disk drive 704 and a compact disk (CD) ROM drive 706 that also communicates with the CPU 702 over the bus as is well known in the art.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope of the present invention.

What is claimed and desired to be secured by United States Letters Patent is:

1. A semiconductor device, comprising:
   a metallic layer over a substrate;
   a dielectric layer over said metallic layer;
   a via hole extending through the dielectric layer to a surface of the metallic layer;
   a titanium aluminide layer lining at least a bottom of the via hole;
   a titanium tungsten layer at least on sides of said via hole; and
   a conductive material on the titanium aluminide layer, said conductive material and said titanium aluminide layer being in contact at an interface, said interface being substantially free from tensile stress between said titanium aluminide layer and said conductive material.

2. A semiconductor device, comprising:
   an aluminum layer over a substrate;
   a dielectric layer on the aluminum layer;
   a via hole extending through the dielectric layer to a surface of the aluminum layer;
   a titanium aluminide layer lining a bottom and sides of the via hole;
   a titanium tungsten layer over the titanium aluminide layer; and
   a conductive plug material on the titanium tungsten layer.

3. A semiconductor memory device, comprising:
   a memory circuit region in a semiconductor substrate;
   a first dielectric layer over the memory circuit region;
   a first metallic layer over the first dielectric layer;
   a contact interconnect between the first metallic layer and the semiconductor substrate;
   an antireflective coating over said first metallic layer;
   a second dielectric layer over the antireflective coating;
   a via hole extending through the second dielectric layer and the antireflective coating to a surface of the first metallic layer;
   a titanium aluminide layer lining at least a bottom of the via hole;
   a titanium tungsten compound containing layer on the titanium aluminide layer and in contact with said titanium aluminide layer at an interface that is substantially free of tensile stress;
   a conductive plug material on the titanium tungsten compound layer; and
   a second metallic layer on the second dielectric layer and electrically connected to the conductive plug material.

4. The semiconductor memory device as recited in claim 3, wherein the titanium aluminide layer is also on the sides of said via.

5. The semiconductor memory device as recited in claim 3, wherein the first metallic layer comprises aluminum.

6. The semiconductor memory device as recited in claim 3, wherein the memory circuit includes a SRAM cell.

7. The semiconductor memory device as recited in claim 3, wherein the memory circuit includes a DRAM cell.

8. A memory module, comprising:
   a substrate comprising a circuit board;
   a plurality of memory chips mounted on the substrate and connected to form a memory circuit, wherein one or more of the memory chips comprise a random access memory (RAM) fabricated on a semiconductor substrate comprising:
   a first metallic layer over the semiconductor substrate;
   an antireflective coating over the first metallic layer;
   a dielectric layer over the antireflective coating;
   a via hole extending through the dielectric layer and the antireflective coating to a surface of the first metallic layer;
   a titanium aluminide layer lining at least a bottom of the via hole;
   a titanium tungsten compound containing layer over the titanium aluminide layer, said titanium tungsten compound layer being in contact with said titanium aluminide layer, wherein said titanium tungsten compound layer experiences approximately no tensile stress from said titanium aluminide layer;
   a conductive plug material formed over the titanium tungsten compound layer, said conductive plug comprising a material selected from the group consisting of molybdenum, titanium, and tantalum;

a second metallic layer on the dielectric layer and electrically connected to the conductive plug material; and a connector on the semiconductor substrate and wired to said memory circuit.

9. A memory module, comprising:

a substrate comprising a circuit board;

a plurality of memory chips mounted on the substrate and connected to form a memory circuit, wherein one or more of the memory chips comprise a random access memory (RAM) fabricated on a semiconductor substrate comprising:

a metallic layer over the semiconductor substrate;

a dielectric layer over the metallic layer;

a via hole extending through the dielectric layer to a surface of the metallic layer;

a titanium aluminide layer lining a bottom and sides of the via hole, a titanium tungsten layer over said first titanium aluminide layer; and a conductive material over the titanium aluminide layer, wherein said conductive material and said titanium aluminide layer are in contact at an interface having approximately no tensile stress from said titanium aluminide layer; and a connector on the semiconductor substrate and wired to said memory circuit.

10. A memory module, comprising:

a substrate comprising a circuit board;

a plurality of memory chips mounted on the substrate and connected to form a memory circuit, wherein one or more of the memory chips comprise a random access memory (RAM) fabricated on a semiconductor substrate comprising:

an aluminum layer over the semiconductor substrate;

a dielectric layer over the aluminum layer;

a via hole extending through the dielectric layer to a surface of the aluminum layer;

a titanium aluminide layer lining a bottom of the via hole;

a titanium tungsten layer substantially free of through cracks on the titanium aluminide layer, wherein said titanium tungsten layer is in contact with said titanium aluminide layer at an interface, said interface being substantially free of tensile stress between said titanium aluminide layer and said titanium tungsten layer;

a conductive plug material on the titanium nitride layer, said conductive plug material being selected from the group consisting of molybdenum, titanium, and tantalum; and a metallic layer on the dielectric layer and electrically connected to the conductive plug material; and a connector on the semiconductor substrate and wired to said memory circuit.

11. A computer system, comprising:

a processor; and a random access memory (RAM) fabricated on a semiconductor chip communicating with the processor and comprising:
a first metallic layer over a substrate;
a dielectric layer over the first metallic layer;
a via hole extending through the dielectric layer to a surface of the first metallic layer;
a titanium aluminide layer lining a bottom and sides of the via hole;
a titanium tungsten containing layer over the titanium aluminide layer;
a conductive plug material formed on the titanium tungsten layer; and
a second metallic layer over the dielectric layer and electrically connected to the conductive plug material.

12. A computer system, comprising:

a processor; and a random access memory (RAM) fabricated on a semiconductor chip communicating with the processor and comprising:
a metallic layer over a substrate;
an antireflective coating over the metallic layer;
a dielectric layer over the antireflective coating;
a via hole extending through the dielectric layer and the antireflective coating to a surface of the metallic layer;
a titanium aluminide layer lining at least a bottom of the via hole;
a titanium tungsten layer lining at least the sides of the via hole; and
a conductive material on the titanium aluminide layer, wherein said conductive material is in contact with said titanium aluminide layer at an interface, said interface being substantially free of tensile stress between said titanium aluminide layer and said conductive material.

13. A computer system, comprising:

a processor; and a random access memory (RAM) fabricated on a semiconductor chip communicating with the processor and comprising:

an aluminum layer over a substrate;

a dielectric layer over the aluminum layer;

a via hole extending through the dielectric layer to a surface of the aluminum layer;

a titanium aluminide layer lining a bottom of the via hole;

a titanium tungsten layer substantially free of through cracks on the titanium aluminide layer, wherein said titanium tungsten layer is in contact with said titanium aluminide layer and said titanium aluminide layer exerts approximately zero tensile stress upon said titanium tungsten layer;

a conductive plug material on the titanium nitride layer; and a metallic layer on the dielectric layer and electrically connected to the conductive plug material.

14. A computer system, comprising:

a processor; and a random access memory (RAM) fabricated on a semiconductor chip communicating with the processor and comprising:
a memory circuit region in a semiconductor substrate;
a first dielectric layer over the memory circuit region;
a first metallic layer over the first dielectric layer, said first metallic layer comprising aluminum;
a contact interconnect between the first metallic layer and the semiconductor substrate;
an antireflective coating over the first metallic layer;
a second dielectric layer over the antireflective coating;
a via hole extending through the second dielectric layer and the antireflective coating to a surface of the first metallic layer;
a titanium aluminide layer lining a bottom and sides of the via hole;

a titanium tungsten layer over said titanium aluminide layer;
a conductive plug material on the titanium tungsten layer, said conductive plug material comprising a metal selected from the group consisting of molybdfenum, titanium, and tantalum; and a second metallic layer on the second dielectric layer and electrically connected to the conductive plug material, said second metallic layer comprising aluminum.

* * * * *